United States Patent
Park et al.

(10) Patent No.: US 9,825,045 B2
(45) Date of Patent: Nov. 21, 2017

(54) NONVOLATILE MEMORY DEVICE

(71) Applicant: SK hynix Inc., Gyeonggi-do (KR)

(72) Inventors: Sung-Kun Park, Gyeonggi-do (KR); Jung-Hoon Kim, Gyeonggi-do (KR); Nam-Yoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/285,003

(22) Filed: May 22, 2014

(65) Prior Publication Data

US 2015/0129949 A1    May 14, 2015

(30) Foreign Application Priority Data

Nov. 11, 2013   (KR) .................. 10-2013-0136077

(51) Int. Cl.
 *H01L 29/788*   (2006.01)
 *H01L 27/11519* (2017.01)
 *H01L 29/66*    (2006.01)
 *H01L 27/11558* (2017.01)

(52) U.S. Cl.
 CPC .. *H01L 27/11519* (2013.01); *H01L 27/11558* (2013.01); *H01L 29/66825* (2013.01)

(58) Field of Classification Search
 CPC ........... H01L 27/11517–27/1156; H01L 299/799–29/7926; H01L 29/42324–29/42336; H01L 27/11558; G11C 16/00–16/02; G11C 14/00; G11C 11/5621
 See application file for complete search history.

(56) References Cited

U.S. PATENT DOCUMENTS

| | | | | |
|---|---|---|---|---|
| 5,111,257 A | * | 5/1992 | Andoh | H01L 27/115 257/316 |
| 6,627,947 B1 | | 9/2003 | Hu et al. | |
| 2008/0142868 A1 | * | 6/2008 | Tak | H01L 21/84 257/315 |
| 2009/0184350 A1 | * | 7/2009 | Kodama | G11C 17/16 257/296 |
| 2009/0267127 A1 | * | 10/2009 | Chen | G11C 16/10 257/314 |
| 2012/0181607 A1 | * | 7/2012 | Ryu | H01L 21/28273 257/337 |
| 2015/0001613 A1 | * | 1/2015 | Yip | H01L 27/115 257/329 |
| 2015/0069377 A1 | * | 3/2015 | Rabkin | H01L 27/1225 257/43 |

FOREIGN PATENT DOCUMENTS

KR   1020140069854   6/2014

* cited by examiner

*Primary Examiner* — Jae Lee
*Assistant Examiner* — Junaiden Mirsalahuddin
(74) *Attorney, Agent, or Firm* — IP & T Group LLP

(57) ABSTRACT

A nonvolatile memory device includes a substrate including a device isolation layer defining an active region, a floating gate and a selection gate arranged side by side at intervals of a first gap over the substrate, a coupling plate formed in the device isolation layer and overlapped with the floating gate, and a contact plug suitable for electrically coupling the coupling plate and the selection gate.

16 Claims, 14 Drawing Sheets

NONVOLATILE MEMORY DEVICE

CROSS-REFERENCE TO RELATED APPLICATIONS

The present application claims priority of Korean Patent Application No. 10-2013-0136077, filed on Nov. 11, 2013, which is incorporated herein by reference in its entirety.

BACKGROUND

1. Field

Exemplary embodiments of the present invention relate to a fabrication technology of a semiconductor device, and more particularly, to a fabrication technology of a nonvolatile memory device.

2. Description of the Related Art

By digital media devices that have appeared recently, it is turning into a living environment where the information may be accessed anywhere and anytime. While an analog is converted into a digital, various devices of the digital system are rapidly spread. The various devices require a storage medium, which can easily store video shot, recorded music and various data. According to the high-density trend, non-memory semiconductor industry also interest in the filed of system on chip (SoC), and the semiconductor industry in the world are engaged in a competitive investment for strengthening of the basic technology of the SoC. The SoC is a technology that all systems are integrated into a single semiconductor. If system design technology of the SoC is not secured, development of the non-memory semiconductor is going to be difficult.

Recently, a multi-function chip in which a digital circuit and analog circuit are mixed becomes mainstream in the field of SoC, an embedded memory for trimming of an analog device or storing internal arithmetic algorithm is needed more and more. However, because the embedded memory is fabricated based on a CMOS process or logic process for forming a logic circuit, it is difficult to increase the integration degree of the embedded memory.

SUMMARY

An embodiment of the present invention is directed to a nonvolatile memory device having an improved integration degree.

In accordance with an embodiment of the present invention, a nonvolatile memory device may include a substrate including a device isolation layer defining an active region, a floating gate and a selection gate arranged side by side at intervals of a first gap over the substrate, a coupling plate formed in the device isolation layer and overlapped with the floating gate, and a contact plug suitable for electrically coupling the coupling plate and the selection gate.

In accordance with an embodiment of the present invention, a nonvolatile memory device may include a device isolation layer defining a plurality of active regions, a plurality of selection gates extended in a direction crossing the active regions and arranged alternately at intervals of a first distance and a second distance greater than the first distance, a plurality of floating gates, each of which is located between neighboring selection gates having the second distance to overlap with the active region, wherein each floating gate is located side by side with a corresponding selection gate, a plurality of coupling plates formed in the device isolation layer, each of which is overlapped with the corresponding floating gate, and a plurality of plugs suitable for electrically coupling the coupling plates and the selection gates.

DETAILED DESCRIPTION

Figure 1:
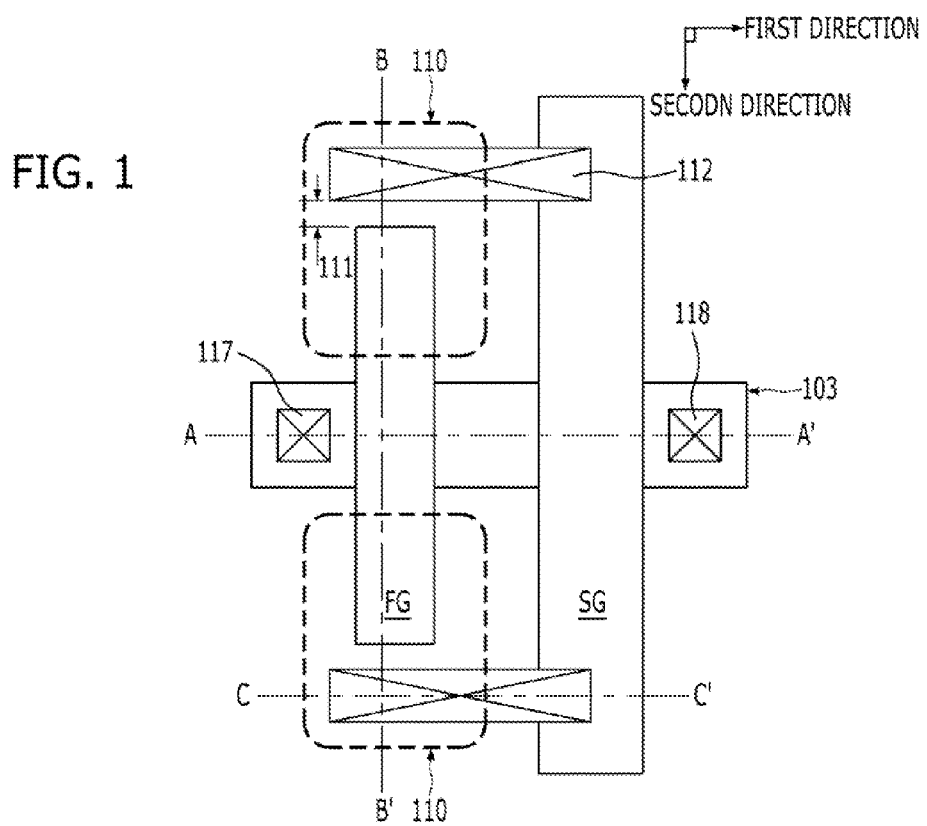
FIG. 1 is a plan view illustrating a unit cell of a nonvolatile memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present invention described below provide a nonvolatile memory device which may be easily applied to an embedded memory in the limelight in the field of a system on chip (SoC) that complex techniques have been aggregated, and with improved integration degree. Especially, a flash Electrically Erasable Programmable Read-Only Memory (flash EEPROM) will be described as an example in embodiments of the present invention. The flash EEPROM is easily applied to the embedded memory.

The flash EEPROM is capable of storing data even without power such as a Read-Only Memory (ROM). The flash EEPROM is a nonvolatile memory device capable of erasing and programming data electrically. The flash EEPROM may include a single gate EEPROM having one gate (for example, a floating gate), a stack gate EEPROM having two gates (for example, a floating gate and a control gate) that are vertically stacked, a dual gate EEPROM having an intermediate form of the single gate EEPROM and the stack gate EEPROM, and a split gate EEPROM.

The single gate EEPROM has the advantage that it may be manufactured without separate additional step in conformity with the logic process. The stack gate EEPROM, the dual gate EEPROM and the split gate EEPROM have the advantage of being able to significantly increase the integration degree as compared to the signal gate EEPROM. However, the cell size of the single gate EEPROM is very large since the single gate EEPROM uses an active coupling gate (ACG) in order to couple a floating gate and has individual means (e.g., well) respectively for programming and erasing. Also, the stack gate EEPROM, the dual gate EEPROM and the split gate EEPROM have the disadvantage of poor productivity since it requires additional masks up to several tens in addition to the logic process.

Embodiments of the present invention described below may provide a nonvolatile memory device having a coupling plate, which may be formed in a device isolation layer to couple the floating gate instead of the active coupling gate having a large size and the control gate requiring several additional masks. As a result, it is possible to improve the operating characteristics and the integration degree while preventing the reduction in productivity by adding a mask during the logic process.

Meanwhile, in the description, a first conductivity type or a second conductivity type represents a conductivity type complementary to each other. That is, when the first conductivity type is P-type, the second conductivity type may be N-type, and when the first conductivity type is N-type, the second conductivity type may be P-type. Therefore, the nonvolatile memory device according to the embodiments of the present invention may be of an N-channel type as well as a P-channel type. Hereinafter, the first conductivity type and the second conductivity type are described as P-type and N-type, respectively, for clear description. That is, the nonvolatile memory device of the N-channel type will be described as an example.

Figure 2A:
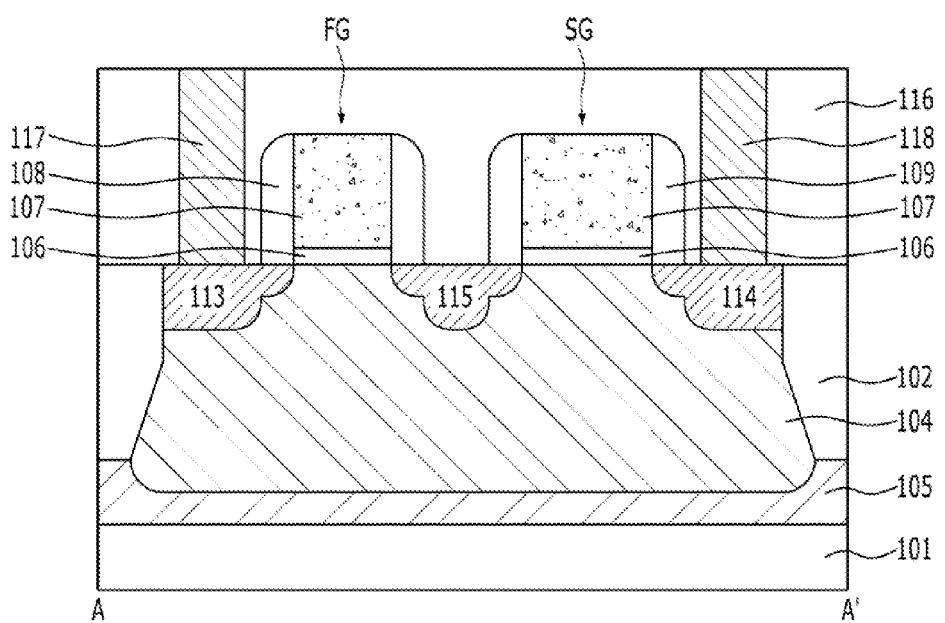
FIGS. 2A to 2C are cross-sectional views illustrating the unit cell of the nonvolatile memory device taken along lines A-A', B-B' and C-C' shown in FIG. 1, respectively.
Figure 2B:
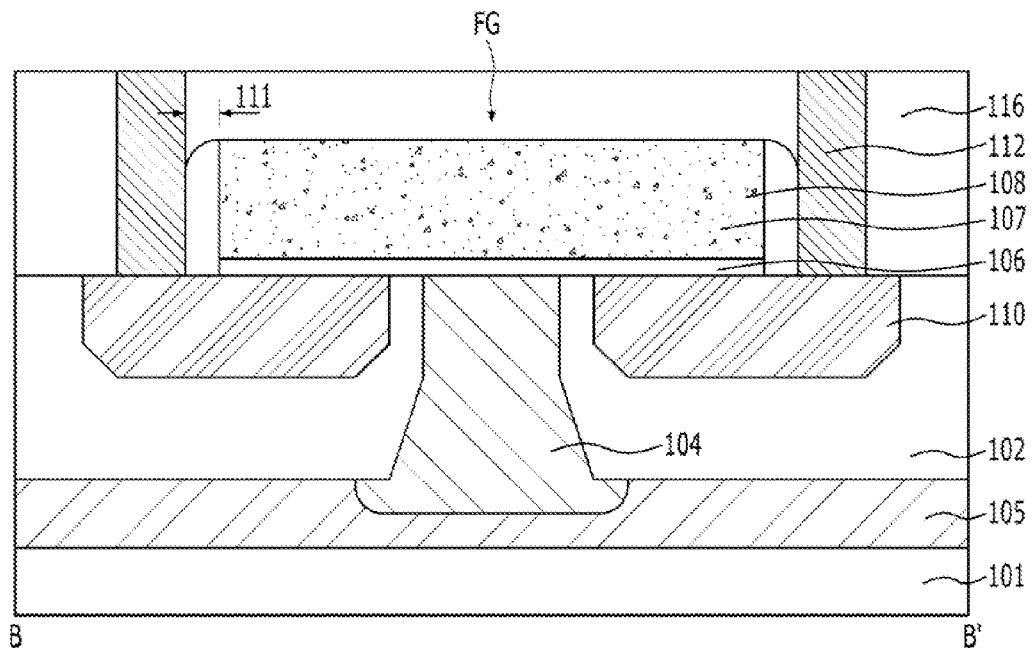
Figure 2C:
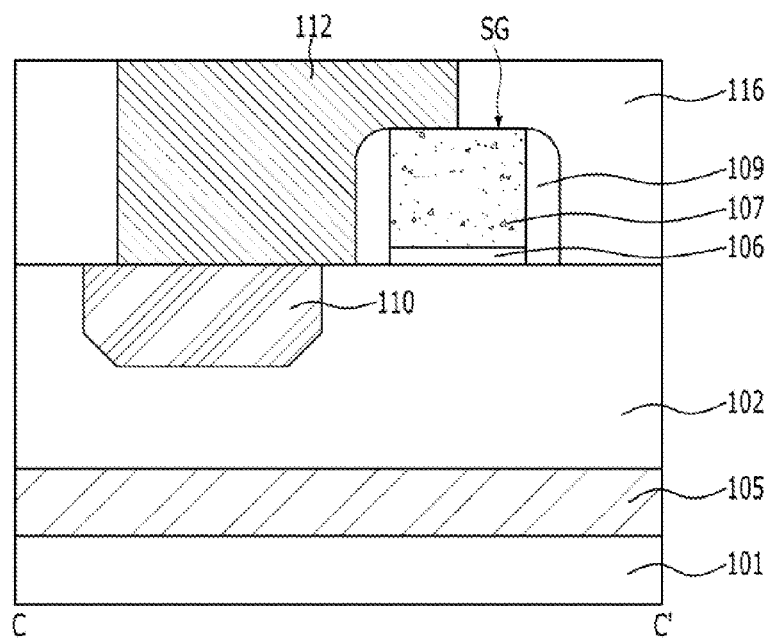
Figure 3:
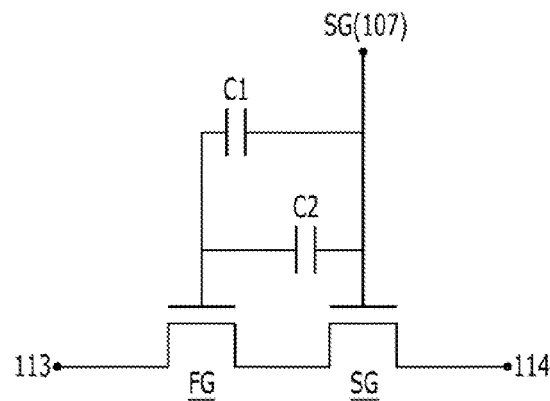
FIG. 3 is a circuit diagram equivalent to the unit cell of the nonvolatile memory device shown in FIGS. 1 and 2A to 2C.

FIG. 1 is a plan view illustrating a unit cell of a nonvolatile memory device in accordance with an embodiment of the present invention. FIGS. 2A to 2C are cross-sectional views illustrating the unit cell of the nonvolatile memory device taken along lines A-A', B-B' and C-C' shown in FIG. 1, respectively. FIG. 3 is a circuit diagram equivalent to the unit cell of the nonvolatile memory device shown in FIGS. 1 and 2A to 2C. FIG. 4A to 4D are plan views illustrating modification examples of the unit cell of the nonvolatile memory device in accordance with the embodiment of the present invention.

Referring to FIGS. 1, 2A to 2C, 3 and 4A to 4D, the nonvolatile memory device in accordance with the embodiment of the present invention may include a device isolation layer 102 formed in a substrate 101 and defining an active region 103, a floating gate FG and a selection gate SG arranged side by side over the substrate 101, a coupling plate 110 formed in the device isolation layer 102 and overlapped with the floating gate FG, and a first contact plug 112 electrically coupling the coupling plate 110 and the selection gate SG. The selection gate SG, the first contract plug 112 and the coupling plate 110 may be electrically coupled to each other and be applied the same bias during the operation.

Hereinafter, components of the nonvolatile memory device in accordance with the embodiment will be described in detail.

The nonvolatile memory device may include a deep well 105 of a second conductivity type (deep N-type well, DNW), an isolated well 104 of a first conductivity type (isolated P-type well, IPW) and the device isolation layer 102 formed in the substrate 101 and defining the active region 103.

The substrate 101 may be a semiconductor substrate. The semiconductor substrate may be a single crystal state, and may include a material containing silicon. That is, the semiconductor substrate may include single crystal silicon contained material. For example, the substrate 101 may be a bulk silicon substrate, or a silicon on insulator (SOI) substrate where a supporting substrate, a buried insulation layer and a single crystal silicon layer are sequentially stacked.

The isolated well 104 of the first conductivity type and the deep well 105 of the second conductivity type may provide an electrical base so that the unit cell may operate. The isolated well 104 and the deep well 105 may be formed through ion-implantation of impurities into the substrate 101. The depth of the deep well 105 may be greater than that of the isolated well 104 in reference to a surface of the substrate 101. That is, a bottom surface of the deep well 105 is lower than a bottom surface of the isolated well 104. In the embodiment, it is described as an example that both the deep well 105 and the isolated well 104 are formed, but according to the operation, the deep well 105 may not be formed and only the isolated well 104 may be formed.

The device isolation layer 102 may be formed through a shallow trench isolation (STI) process, and may include insulation materials. The depth of the device isolation layer 102 may be smaller than that of the isolated well 104 in reference to the surface of the substrate 101. That is, a bottom surface of the device isolation layer 102 is higher than a bottom surface of the isolated well 104. The active region 103 may be defined by the device isolation layer 102. The active region 103 may be a bar type or a line type that has a major axis in a first direction and a minor axis in a second direction crossing the first direction.

The nonvolatile memory device may include a floating gate FG formed over the substrate 101, a selection gate SG formed over the substrate 101 of one side of the floating gate FG and arranged side by side with the floating gate FG, and spacers 108 and 109 formed over sidewalls of the floating gate FG and the selection gate SG.

The floating gate FG may store logic information, and the selection gate SG may prevent over-erase. The floating gate FG and the selection gate SG may be extended in the second direction and may be a bar type or a line type simultaneously crossing the active region 103 and the device isolation layer 102.

Figure 4A:
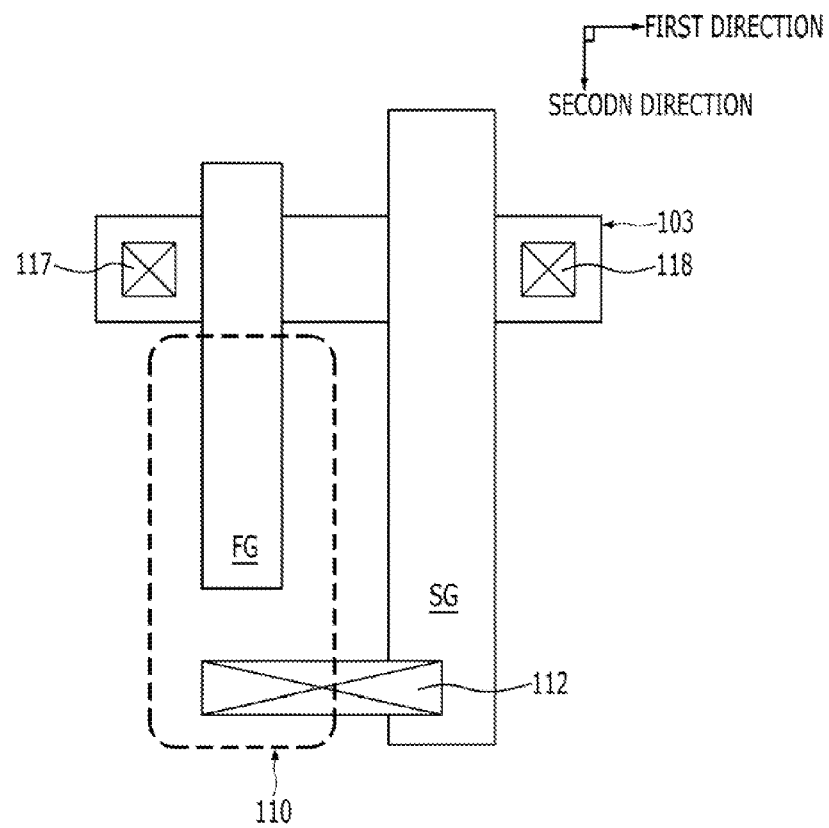
FIG. 4A to 4D are plan views illustrating modification examples of the unit cell of the nonvolatile memory device in accordance with the embodiment of the present invention.

Lengths of both ends of the floating gate FG in the second direction extended from the active region 103 may be identical with each other as shown in FIG. 1, or may be different from each other as shown in FIG. 4A. The floating gate FG and the selection gate SG may be a stacked structure of a gate insulation layer 106 and a gate electrode 107. The floating gate FG and the selection gate SG may be formed simultaneously. The gate insulation layer 106 may include one or more stacked layers selected from a group including an oxide layer, a nitride layer and an oxynitride layer. The gate insulation layer 106 disposed in a region where the floating gate FG and the coupling plate 110 are overlapped may act as a charge blocking layer. In the embodiment of the present invention, the region where the floating gate FG and the coupling plate 110 are overlapped and the other region of the gate insulation 106 are shown as the same thickness and the same material, but the region and the other region of the gate insulation 106 may have different thickness and different materials. The gate electrode 107 may include a material containing silicon such as a polysilicon layer. An impurity may or may not be doped in the polysilicon layer.

The spacers 108 and 109 may include one or more stacked layers selected from the group including an oxide layer, a nitride layer and an oxynitride layer. The spacer 108, which may be formed over sidewalls of the floating gate FG, may act as a charge blocking layer between the floating gate FG and the first contact plug 112.

In the embodiment of the present invention, it is described as an example that the floating gate FG and the selection gate SG have a planar gate structure, but the floating gate FG and the selection gate SG may have a 3-dimensional gate structure, for example a recess gate structure or a fin gate structure.

The nonvolatile memory device in accordance with the embodiment of the present invention may include the coupling plate 110 formed in the device isolation layer 102 and coupling the floating gate FG, and the first contact plug 112 electrically coupling the selection gate SG and the coupling plate 110. The coupling plate 110 and the first contact plug 112 may include a conductive material. For example, the coupling plate 110 and the first contact plug 112 may include a silicon layer or a metallic layer.

The coupling plate 110 may be overlapped with the floating gate FG, and the coupling plate 110 may couple the floating gate FG through capacitance C1 formed between the coupling plate 110 and the floating gate FG as shown in FIG. 3. That is, the floating gate FG may be coupled in response to a bias voltage supplied to the coupling plate 110. Since the coupling plate 110 is disposed in the device isolation layer 102, the integration degree of the nonvolatile memory device may be increased by utilizing the device isolation layer 102. Also, since the coupling plate 110 is disposed in the device isolation layer 102 of an nonpolar, the polarity of the bias voltage, e.g., positive or negative polarity, applied to the coupling plate 110 may not be restricted. If the coupling plate 110 is disposed in a well structure, the polarity of the bias voltage applied to the coupling plate 110 may be restricted in response to a conductive type of the well structure.

As a result, various methods may become available during program operation and erase operation. For example, the various methods may include a hot carrier injection (HCI) method, a band to band tunneling (BTBT) method and a Fowler-Nordheim (FN) tunneling method. Especially, FN tunneling method may be easily applied because of no restriction from the polarity of the bias.

Figure 4B:
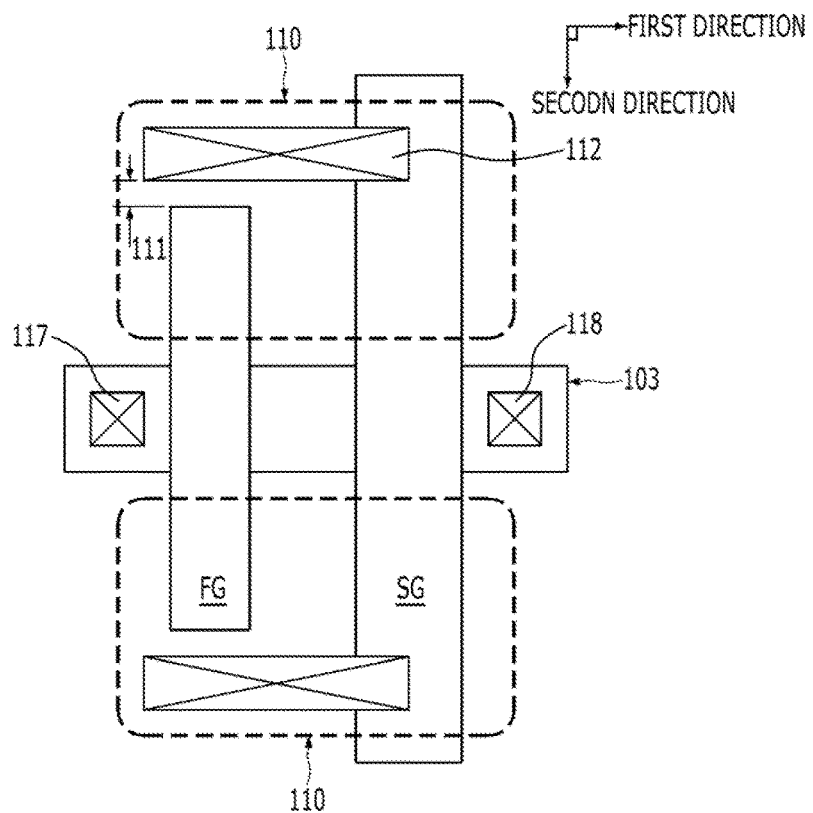
Figure 4C:
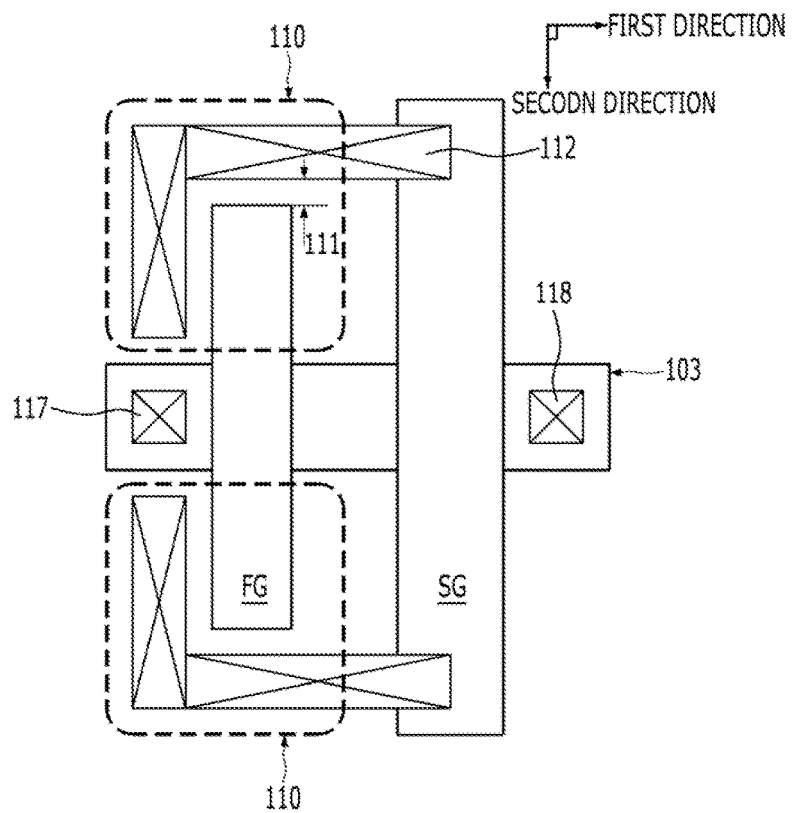

The coupling plate 110 may be overlapped with the floating gate FG as shown in FIGS. 1, 4A, 4C and 4D, or the coupling plate 110 may overlapped with both the floating gate FG and the selection gate SG as shown in FIG. 4B. Because the coupling plate 110 and the selection gate SG are provided with the same bias, the coupling plate 110 may be overlapped with the selection gate SG. When the coupling plate 110 is extended and overlapped to the selection gate SG, productivity may be increased by decreasing difficulty of forming process of the coupling plate 110. The coupling plate 110 may be provided in the plural. The plurality of coupling plates 110 may be symmetrically arranged in reference to the active region 103 as shown in FIGS. 1 and 4B to 4D. Also, the coupling plate 110 may be arranged at one side of the active region 103 as shown in FIG. 4A. As the overlap area overlapped by the coupling plate 110 and the floating gate FG is increased, the coupling ratio between the coupling plate 110 and the floating gate FG may be increased, and thus, the integration degree may be improved. Therefore, various forms of the floating gate FG and the coupling plate 110 may be applicable to increase the overlap area overlapped by the floating gate FG and the coupling plate 110 in a limited area.

The first contact plug 112 may electrically couple the selection gate SG and the coupling plate 110 by penetrating an interlayer insulating layer 116, and the first contact plug 112 as well as the coupling plate 110 may couple the floating gate FG. That is, the first contact plug 112 may couple the floating gate FG through capacitance C2 formed between sidewall of the first contact plug 112 and the facing sidewall of the floating gate FG as shown in FIG. 3.

Figure 4D:
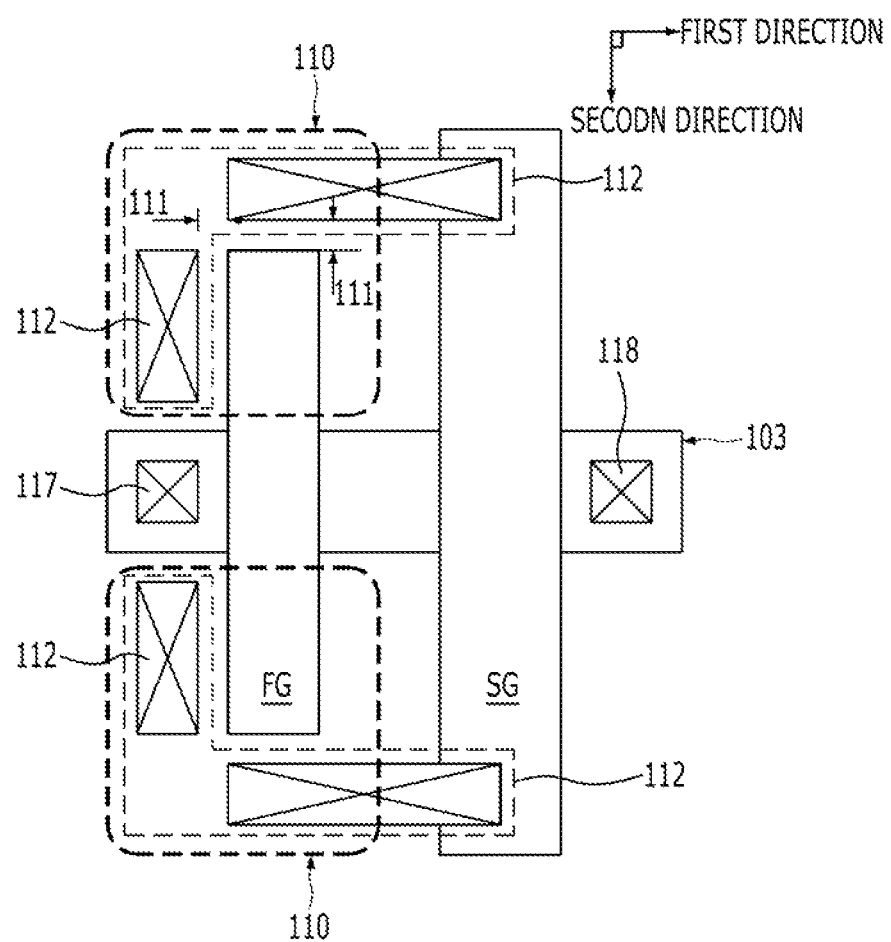

The first contact plug 112 may be adjacent to the floating gate FG with a gap 111 between the first contact plug 112 and the floating gate FG. A charge blocking layer may be filled in the gap 111. As line width of the gap 111 is reduced, coupling ratio between the first contact plug 112 and the floating gate FG may increase. The charge blocking layer may be a spacer 108 formed over sidewall of the floating gate FG and include insulating materials. In order to increase the coupling ratio between the first contact plug 112 and the floating gate FG, the first contact plug 112 may have one or more plugs having one or more sidewalls facing the sidewalls of the floating gate FG. For example, the first contact plug 112 may have one or more sidewall facing the sidewalls of the floating gate FG as shown in FIGS. 1, 4A to 4C. Also, the first contact plug 112 may be provided in the plural. The plurality of first contact plugs 112 may have one or more sidewall facing the sidewalls of the floating gate FG as shown in FIG. 4D. As the coupling ratio between the first contact plug 112 and the floating gate FG increases, the integration degree may be increased. For this reason, various shapes of the first contact plug 112 and the floating gate FG may be applicable to increase the overlap area overlapped by the coupling plate 110 and the floating gate FG in the limited area.

The nonvolatile memory device in accordance with the embodiment of the present invention may include a first junction region 113 formed at the other side of the floating gate FG in the active region 103, a second junction region 114 formed at one side of the selection gate SG in the active region 103, a third junction region 115 formed between the floating gate FG and the selection gate SG in the active region 103, the interlayer insulating layer 116 formed over the entire of the substrate 101, a second contact plug 117 coupled to the first junction region 113 by penetrating the interlayer insulating layer 116, and a third contact plug 118 coupled to the second junction region 114 by penetrating the interlayer insulating layer 116. The first junction region 113, the second junction region 114 and the third junction region 115 may be impurity regions formed by ion-implanting impurities of the second conductivity type into the substrate 101. The first junction region 113 and the second junction region 114 may act as a source region and a drain region, respectively, and the third junction region 115 may electrically couple channels induced by the selection gate SG and the floating gate FG. The first junction region 113, the second junction region 114, and the third junction region 115 may have a lightly doped drain (LDD) structure. The interlayer insulating layer 116 may include one or more stacked layers selected from the group including an oxide layer, a nitride layer and an oxynitride layer. The second contact plug 117 and the third contact plug 118 may be formed simultaneously with the first contact plug 112, and may include conductive materials.

The nonvolatile memory device in accordance with the embodiment of the present invention may increase the integration degree by the coupling plate 110 formed in the device isolation layer 102 to overlap with the floating gate FG. Also, the nonvolatile memory device may further improve the integration degree by the first contact plug 112 coupled with the floating gate FG.

As the coupling ratio with respect to the floating gate FG increases by adapting the coupling plate 110 and the first contact plug 112, the integration degree may be improved and variety of operating methods may be secured, and thus, the operation characteristics may be improved.

Also, since the coupling plate 110 may not be restricted by the polarity of the bias applied thereto due to the location of the coupling plate 110 in the device isolation layer 102, the size of the peripheral circuit for supplying a bias to the memory cell may be reduced, and various known operation methods may be applicable.

Since the nonvolatile memory device having the above structure may be formed by adding only one mask in addition to the logic process, the reduction in productivity may be prevented. A detailed description of a method for fabricating the nonvolatile memory device will be set forth later.

It will be described that a nonvolatile memory device in accordance with an embodiment of the present invention may further use the selection gate SG to couple the floating gate FG in addition to the coupling plate 110 and the first contract plug 112 in order to further increase the integration degree thereof. Hereinafter, for clear description, the reference numeral of the embodiment shown in FIGS. 5 to 7, which is the same as FIGS. 1 to 4D, may indicate the same element as the previous embodiment described with respect to FIGS. 1 to 4D.

Figure 5:
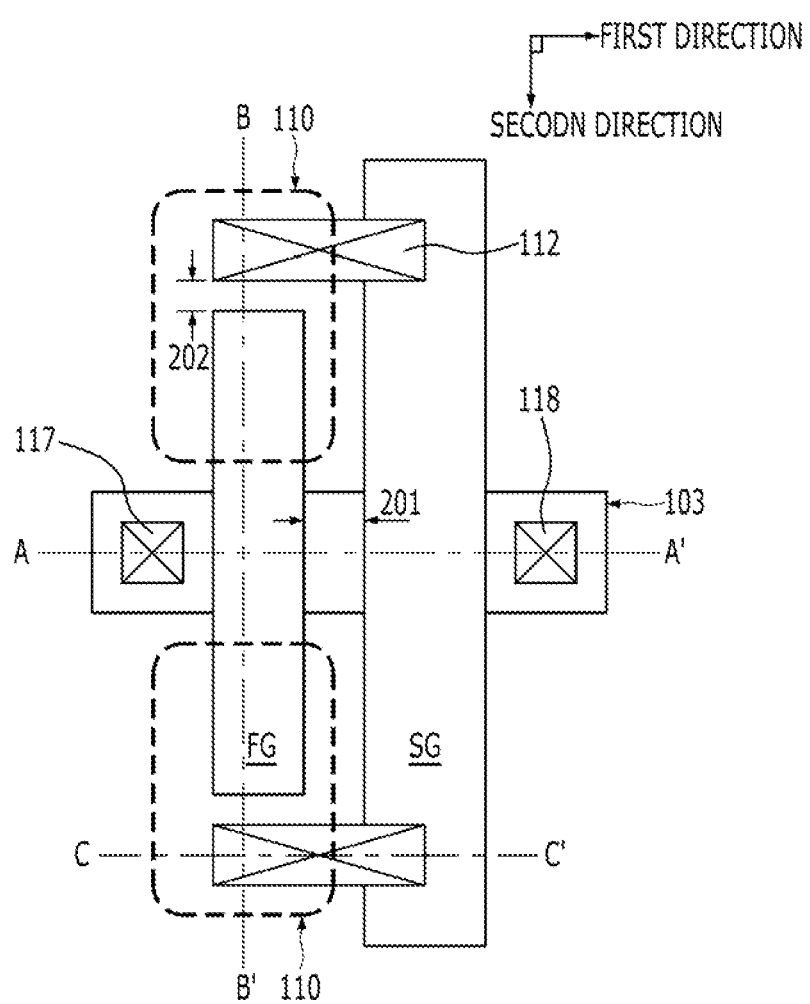
FIG. 5 is a plan view illustrating a unit cell of a nonvolatile memory device in accordance with an embodiment of the present invention.
Figure 6A:
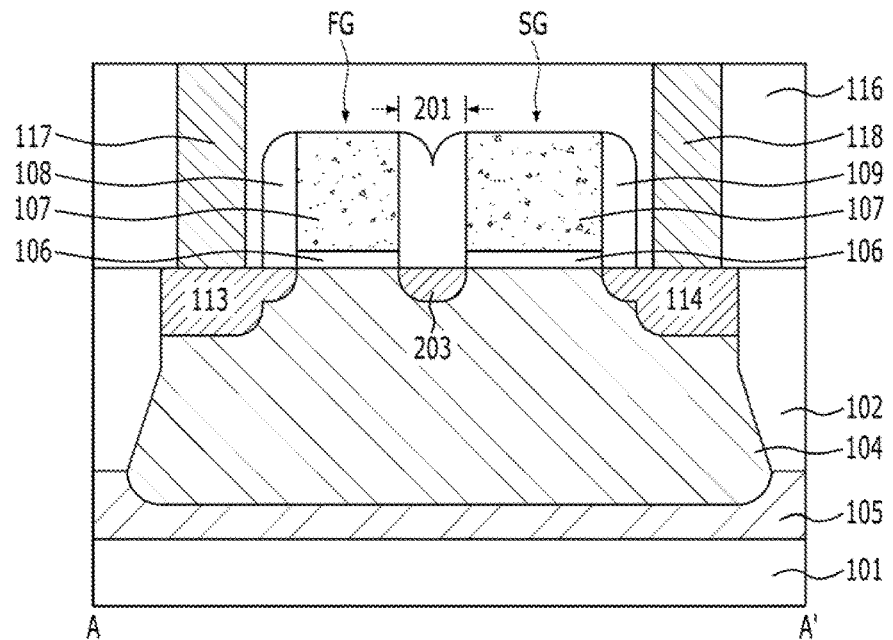
FIGS. 6A to 6C are cross-sectional views illustrating the unit cell of the nonvolatile memory device taken along lines A-A', B-B' and C-C' shown in FIG. 5, respectively.
Figure 6B:
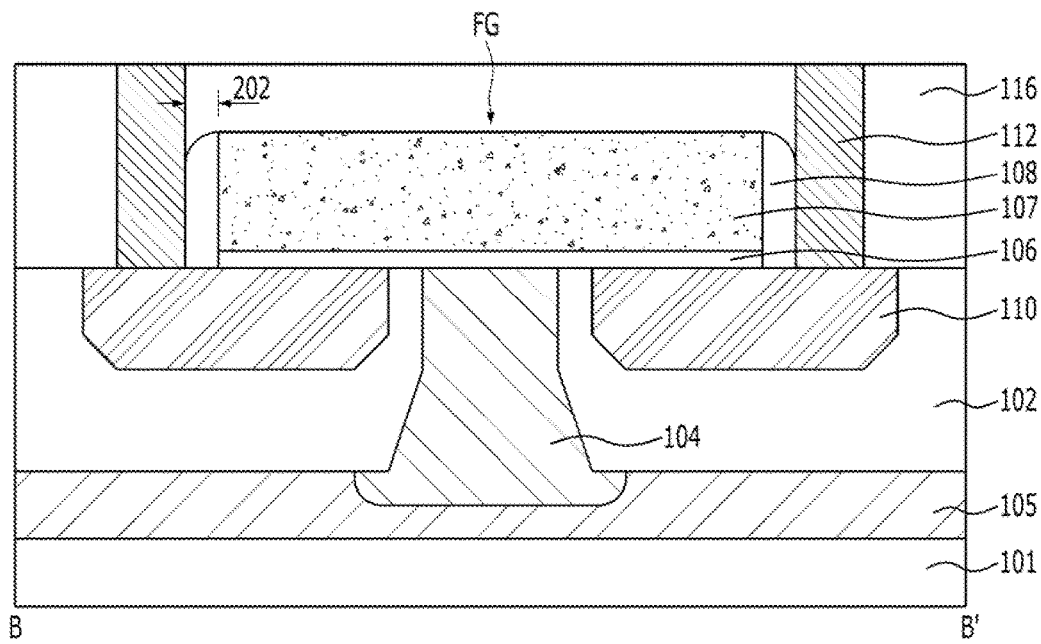
Figure 6C:
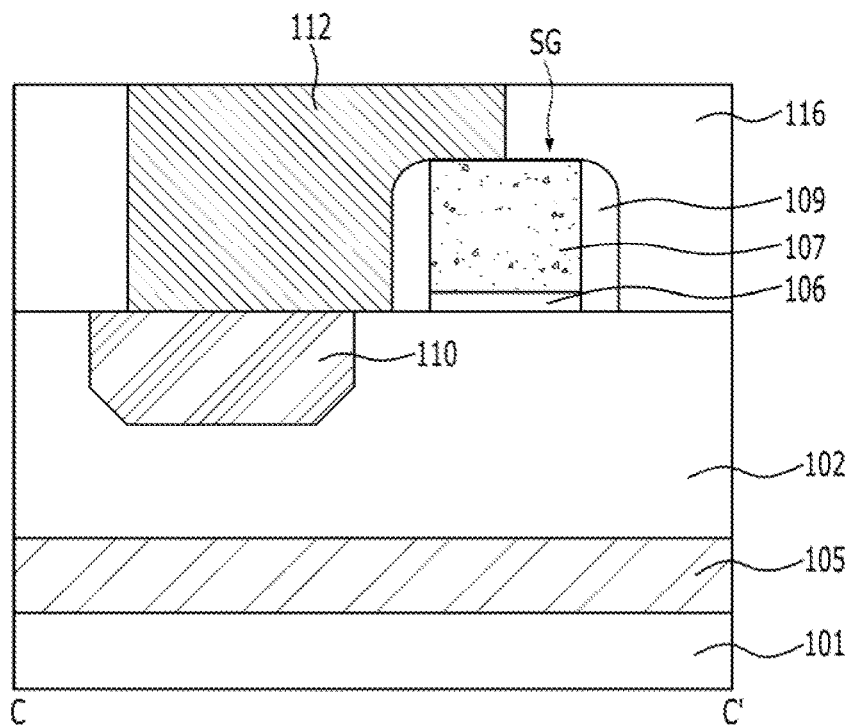
Figure 7:
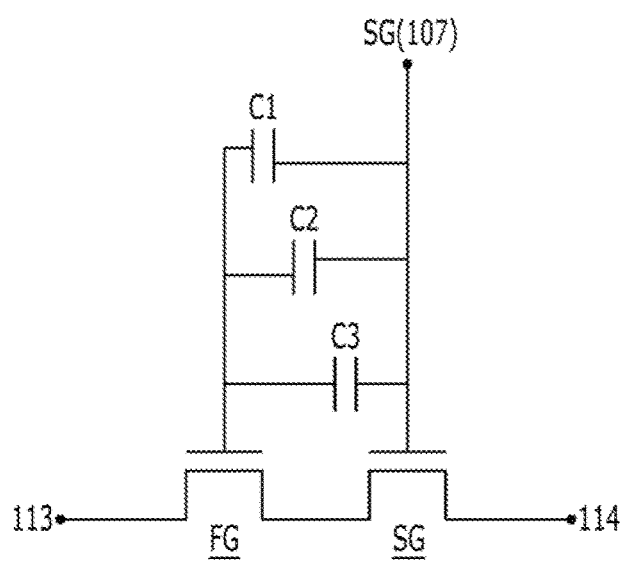
FIG. 7 is a circuit diagram equivalent to the unit cell of the nonvolatile memory device shown in FIGS. 5 and 6A to 6C.

FIG. 5 is a plan view illustrating a unit cell of a nonvolatile memory device in accordance with the embodiment of the present invention. FIGS. 6A to 6C are cross-sectional views illustrating the unit cell of the nonvolatile memory device taken along lines A-A', B-B' and C-C' shown in FIG. 5, respectively. FIG. 7 is a circuit diagram equivalent to the unit cell of the nonvolatile memory device shown in FIGS. 5 and 6A to 6C.

Referring to FIGS. 5, 6A to 6C and 7, the nonvolatile memory device in accordance with the embodiment of the present invention may include a device isolation layer 102 formed in a substrate 101 and defining an active region 103, a floating gate FG and a selection gate SG arranged side by side at intervals of a first gap 201 over the substrate 101, a coupling plate 110 formed in the device isolation layer 102 and overlapped with the floating gate FG, a first contact plug 112 electrically coupling the coupling plate 110 and the selection gate SG, and a charge blocking layer filling the gap 201.

The nonvolatile memory device may include a deep well 105 of a second conductivity type formed in the substrate 101, an isolated well 104 of a first conductivity type formed over the deep well 105, and the device isolation layer 102 formed in the substrate 101 and defining the active region 103. The isolated well 104 of the first conductivity type and the deep well 105 of the second conductivity type may provide an electrical base so that the unit cell may operate. The device isolation layer 102 may be formed by a shallow trench isolation (STI) process and may include insulation materials. The active region 103 defied by the device isolation layer 102 may be a bar type or a line type that has a major axis in a first direction and a minor axis in a second direction crossing the first direction.

The nonvolatile memory device may include a floating gate FG formed over the substrate 101, a selection gate SG formed over the substrate 101 of the other side of the floating gate FG and arranged side by side with the floating gate FG at intervals of the first gap 201, the charge blocking layer filling the first gap 201, and spacers 108 and 109 formed over sidewalls of the floating gate FG and the selection gate SG.

The floating gate FG may store logic information. The selection gate SG may prevent over-erase and couple the floating gate FG. The selection gate SG may have one or more sidewalls facing sidewalls of the floating gate FG. That is, the selection gate SG may couple the floating gate FG through capacitance C3 formed between sidewall of the selection gate SG and the facing sidewall of the floating gate FG as shown in FIG. 7. Also, the first gap 201 may be disposed between the selection gate SG and the floating gate FG, and the first gap 201 may be filled with the charge blocking layer. As a line width of the first gap 201 is reduced, coupling ratio between the selection gate SG and the floating gate FG may increase. The charge blocking layer may include the spacer 108 formed over sidewall of the floating gate FG and the spacer 109 formed over sidewall of the selection gate SG. The spacer 108 formed over sidewall of the floating gate FG may act as the charge blocking layer between the floating gate FG and the first contact plug 112.

The nonvolatile memory device in accordance with the embodiment of the present invention may include the coupling plate 110 formed in the device isolation layer 102 and coupling the floating gate FG, and the first contact plug 112 electrically coupling the selection gate SG and the coupling plate 110. The coupling plate 110 may be overlapped with the floating gate FG, and the coupling plate 110 may couple the floating gate FG through the capacitance C1 formed between the coupling plate 110 and the floating gate FG as shown in FIG. 7. The first contact plug 112 may electrically couple the selection gate SG and the coupling plate 110 by penetrating an interlayer insulating layer 116, and the first contact plug 112 as well as the coupling plate 110 may couple the floating gate FG and the selection gate SG. That is, the first contact plug 112 may couple the floating gate FG through the capacitance C2 formed between sidewall of the first contact plug 112 and the facing sidewall of the floating gate FG as shown in FIG. 7. The first contact plug 112 may be adjacent to the floating gate FG with a second gap 202 between the first contact plug 112 and the floating gate FG. A charge blocking layer may be filled in the second gap 202. As a line width of the second gap 202 is reduced, coupling ratio between the first contact plug 112 and the floating gate FG may increase. The charge blocking layer may be a spacer 108 formed over sidewall of the floating gate FG and include insulating materials.

The nonvolatile memory device in accordance with the embodiment of the present invention may include a first junction region 113 formed at the other side of the floating gate FG in the active region 103, a second junction region 114 formed of one side of the selection gate SG in the active region 103, a third junction region 203 formed between the floating gate FG and the selection gate SG in the active region 103, the interlayer insulating layer 116 formed over the entire of the substrate 101, a second contact plug 117 coupled ed to the first junction region 113 by penetrating the interlayer insulating layer 116, and a third contact plug 118 coupled ed to the second junction region 114 by penetrating the interlayer insulating layer 116. The first junction region 113 and the second junction region 114 may act as a source region and a drain region, respectively, and may have the lightly doped drain (LDD) structure with a low concentration impurity region and a high concentration impurity region. The third junction region 203 may electrically couple channels induced by the selection gate SG and the floating gate FG, and the third junction region 203 may have the same doping concentration as the low concentration impurity region of the first junction region 113 and the second junction region 114. The second contact plug 117 and the third contact plug 118 may be formed simultaneously with the first contact plug 112, and they may include conductive materials.

The nonvolatile memory device in accordance with the embodiment of the present invention may increase the integration degree by the coupling plate 110 formed in the device isolation layer 102 to overlap with the floating gate FG. Also, the nonvolatile memory device may further improve the integration degree by the first contact plug 112 and the selection gate SG coupled with the floating gate FG.

As the coupling ratio with respect to the floating gate FG increases by adapting the coupling plate 110, the first contact plug 112 and the selection gate SG, the integration degree may be improved and variety of operating methods may be applied, and thus, the operation characteristics may be improved.

Also, since the coupling plate 110 may not be restricted by the polarity of the bias applied thereto due to the location of the coupling plate 110 in the device isolation layer 102, the size of the peripheral circuit for supplying a bias to the memory cell may be reduced, and various known operation methods may be applicable.

Since the nonvolatile memory device having the above structure may be formed by adding only one mask in addition to the logic process, the reduction in productivity may be prevented. A detailed description of a method for fabricating the nonvolatile memory device is described below.

Hereinafter, an operation method of the nonvolatile memory device in accordance with an embodiment will be described with reference to Table 1 below. The nonvolatile memory device in accordance with the embodiment may be applied a hot carrier injection (HCI) method or a FN tunneling method for program operation, and may be applied a band to band tunneling (BTBT) method or the FN tunneling method for erase operation. Table 1 represents operation conditions of the nonvolatile memory device in accordance with the embodiment. In Table 1, the FN tunneling method is used for the program operation and the erase operation. Because the FN tunneling method requires greater coupling ratio with respect to the floating gate FG compare to the HCI method and the BTBT method. That is, when the sufficient coupling ratio is secured, operation using the FN tunneling method is possible. The nonvolatile memory device in accordance with the embodiment may secure the coupling ratio, which may be applied to the FN tunneling method by adapting the coupling plate 110.

TABLE 1

| | Operation | | | |
| --- | --- | --- | --- | --- |
| | Program | Erase | Read | |
| Method | FN tunneling | FN tunneling | Forward | Reverse |
| (1st contact plug/ Coupling plate) | Vpp_1 | -Vpp_1 | Vcc | Vcc |

TABLE 1-continued

| | Operation | | | |
| --- | --- | --- | --- | --- |
| | Program | Erase | Read | |
| Method | FN tunneling | FN tunneling | Forward | Reverse |
| 1st junction region (2nd contact plug) | Floating | Floating | Vread (~1 V) | GND |
| 2nd junction region (3rd contact plug) | Floating | Floating | GND | Vread (~1 V) |
| Substrate (Isolated well/ Deep well) | -Vpp_2 | Vpp_2 | GND | GND |

The FN tunneling method may be used during the program operation. Specifically, during floating states of the first junction region 113 and the second junction region 114, a first pumping voltage Vpp_1 and a negative second pumping voltage -Vpp_2 may be applied to the selection gate SG and the substrate 101, respectively. The first pumping voltage Vpp_1 and a second pumping voltage Vpp_2 may be obtained by boosting a power supply voltage Vcc, and the magnitude of the first pumping voltage Vpp_1 may be larger than that of the second pumping voltage Vpp_2 (Vpp_1>Vpp_2). It is to ensure the stable operation characteristics that the substrate 101 is provided with the bias smaller than that of the selection gate SG is provided with.

The FN tunneling method may also be used during the erase operation. Specifically, during floating states of the first junction region 113 and the second junction region 114, a negative first pumping voltage -Vpp_1 and a second pumping voltage Vpp_2 may be applied to the selection gate SG and the substrate 101, respectively.

The read operation may include a forward read operation and a reverse read operation. The forward read operation may be performed through the same charge transfer direction as the program operation, and the reverse read operation may be performed through the opposite charge transfer direction to the charge transfer direction of the program operation. Since the forward read operation may be implemented by a cell array of simple structure compared to the reverse read operation, the forward read operation may be advantageous in terms of the integration degree and the difficulty of the process. On the other hand, the reverse read operation has a greater tolerance with respect to a read disturbance compared to the forward read operation.

In case of the forward read operation, the power supply voltage Vcc may be applied to the selection gate SG, a read voltage Vread and a ground voltage GND may be applied to the first junction region 113 and the second junction region 114, respectively. On the other hand, in case of the reverse read operation, the power voltage Vcc may be applied to the selection gate SG to couple the floating gate FG, the ground voltage GND and the read voltage Vread may be applied to the first junction region 113 and the second junction region 114, respectively. The power supply voltage Vcc may have a magnitude between the magnitudes of the read voltage Vread and the second pumping voltage Vpp_2 (Vread≤Vcc≤Vpp_2).

Hereinafter, it will be described in detail with reference to FIGS. 8A to 8E that the nonvolatile memory device in accordance with an embodiment of the present invention may be easily implemented by adding only one mask in addition to the logic process. A method for fabricating a nonvolatile memory device described with reference to FIGS. 5 to 7 will be exemplary explained.

FIGS. 8A to 8E are cross-sectional views illustrating a method for fabricating a nonvolatile memory device in accordance with an embodiment of the present invention taken by cutting along A-A' line and B-B' line of FIG. 5.

Figure 8A:
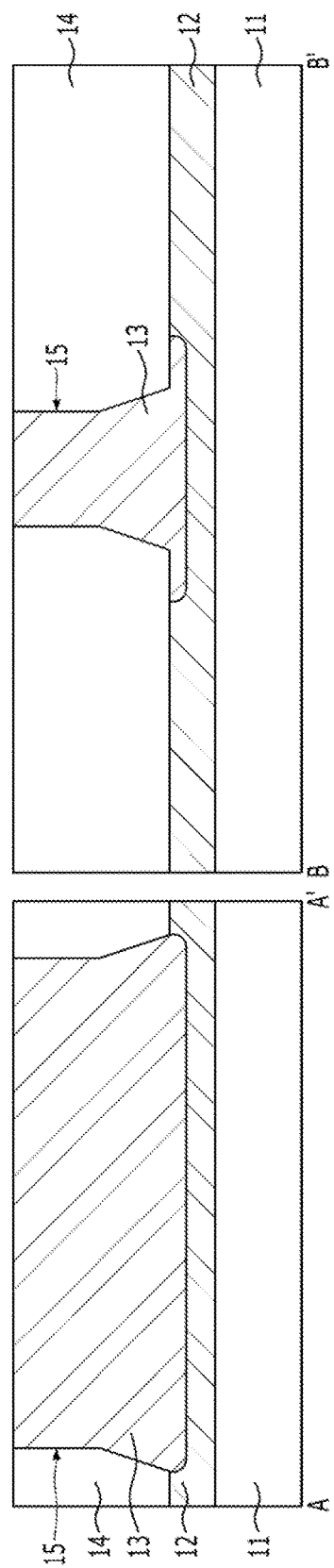
FIGS. 8A to 8E are cross-sectional views illustrating a method for fabricating a nonvolatile memory device in accordance with an embodiment of the present invention.

Referring to FIG. 8A, a substrate 11 may be prepared. The substrate 11 may have a logic area (not Illustrated) and a memory area (not illustrated). A complementary metal-oxide semiconductor (CMOS) may be formed in the logic area, and the nonvolatile memory device in accordance with an embodiment of the present invention may be formed in the memory area. The substrate 11 may be a semiconductor substrate. The semiconductor substrate may be a single crystal state, and may include a material containing silicon. That is, the semiconductor substrate may include a single crystal silicon contained material. For example, the substrate 11 may be a bulk silicon substrate, or a silicon on insulator (SOI) substrate.

Subsequently, a deep well 12 of a second conductivity type and an isolated well 13 of a first conductivity type may be formed in the substrate 11. The deep well 12 and the isolated well 13 may be formed through formation of a first mask pattern (not illustrated) over the substrate 11, ion-implantation into the substrate 11 with impurities using the first mask pattern as an ion-implantation barrier, and an annealing process for activation of the implanted impurities.

Subsequently, an active area 15 may be defined over the substrate 11 by forming a device isolation layer 14. The device isolation layer 14 may be formed by a shallow trench isolation (STI) process. The STI process may be a series of steps of forming a trench for isolation over the substrate 11 and filling an insulating material inside the trench.

Figure 8B:
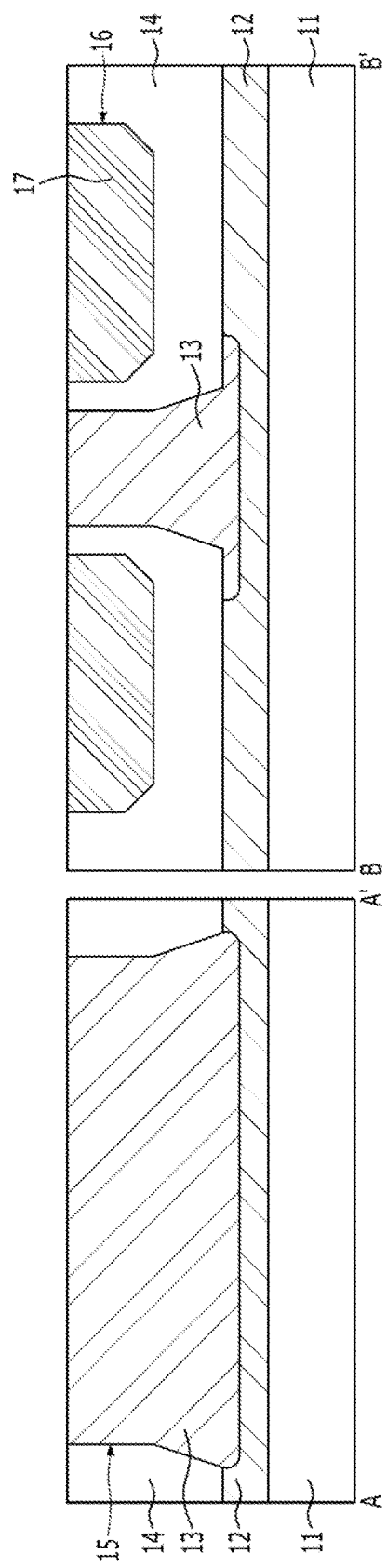

Referring to FIG. 8B, a second mask pattern (not illustrated) may be formed over the substrate 11 by adding a mask in addition to the logic process. A trench 16 may be formed by etching the device isolation layer 14 using the second mask pattern as an etch barrier.

Subsequently, a conductive layer may be formed over the entire of the substrate 11 to fill the trench 16, and a coupling plate 17 filling the trench 16 may be formed by performing a planarization process until the surface of the substrate 11 is exposed. The planarization process may include a chemical mechanical polishing method and a blanket etch process.

Figure 8C:
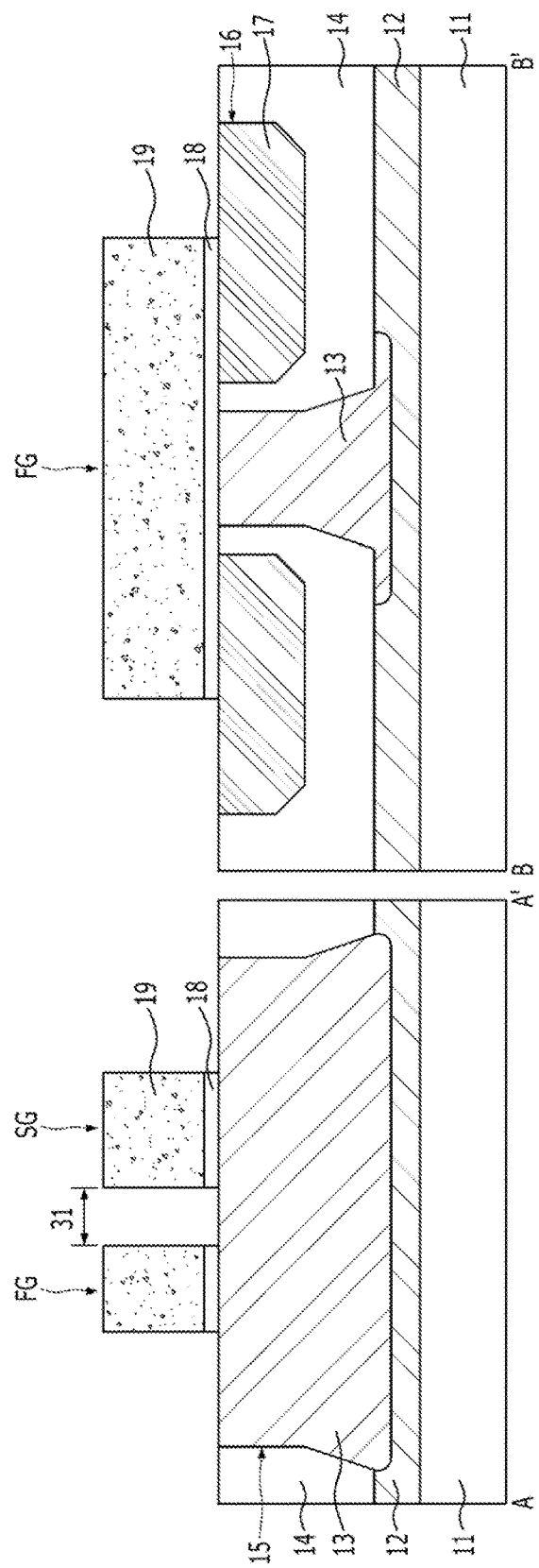

Referring to FIG. 8C, a gate insulation layer 18 and a gate conductive layer may be sequentially formed over the entire substrate 11. The gate insulation layer 18 may include one or more stacked layers selected from the group including an oxide layer, a nitride layer and an oxynitride layer. The gate insulation layer 18 corresponding to the active region 15 and the gate insulation layer 18 corresponding to the coupling plate 17 may have the same material and the same thickness, or may have different materials and different thicknesses. The gate conductive layer may be formed by a material containing silicon, and the material containing silicon may be a silicon layer. For example, the gate conductive layer may be formed by a polysilicon layer.

Subsequently, a third mask pattern (not illustrated) may be formed over the gate conductive layer. A floating gate FG and a selection gate SG each having the gate insulation layer 18 and a gate electrode 19 may be formed by etching the gate conductive layer and the gate insulation layer sequentially by using the third mask pattern as an etch barrier. The floating gate FG and the selection gate SG may be arranged side by side at intervals of a first gap 31.

Although not illustrated in the drawings, a logic gate LG may be formed in the logic area when the floating gate FG and the selection gate SG are formed. Also, before forming of the gates FG, SG and LG, predetermined amount of impurities may be implanted into the gate conductive layer to ensure each gate characteristic (e.g., work function).

Figure 8D:
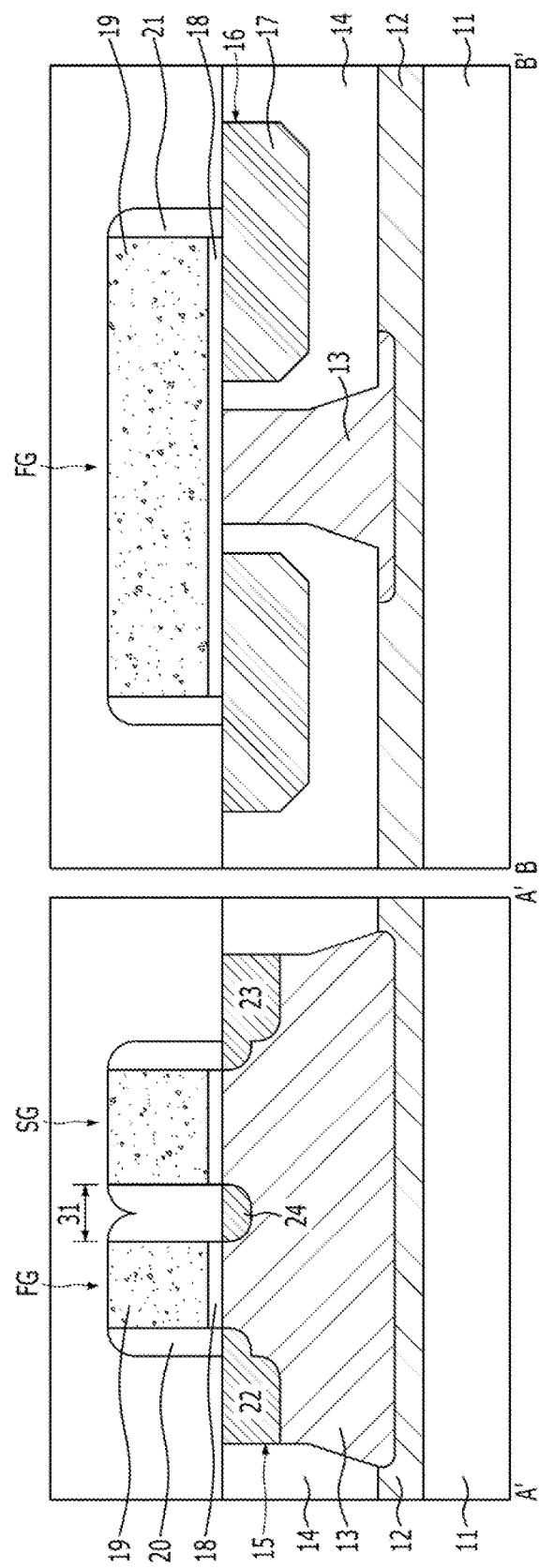

Referring to FIG. 8D, a first junction region 22, a second junction region 23 and a third junction region 24 of the second conductivity type may be formed at sides of the floating gate FG and the selection gate SG over the active region 15. The first to third junction regions 22 to 24 may be formed by ion-implanting the impurities of the second conductivity type into the substrate 11.

The first junction region 22 and the second junction region 23 may have the lightly doped drain (LDD) structure with a low concentration impurity region and a high concentration impurity region, and the third junction region 24 may have the same doping concentration of the low concentration impurity region of the first junction region 22 and the second junction region 23.

Subsequently, a spacer 20 and 21 may be formed over sidewalls of the floating gate FG and the selection gate SG. The spacer 20 and 21 may fill the first gap 31. The spacer 20 and 21 filling the first gap 31 may act as a charge blocking layer between the floating gate FG and the selection gate SG. The spacer 20 and 21 may include one or more stacked layers selected from the group including an oxide layer, a nitride layer and an oxynitride layer.

After forming of the spacer 20 and 21, a silicide layer (not illustrated) may be formed over the surfaces of the gates FG, SG and LG, the first junction region 22 and the second junction region 23. The silicide layer (not illustrated) may be formed over only the surfaces of the first junction region 22 and the second junction region 23.

Subsequently, an interlayer insulation layer 25 may be formed over the substrate 11. The interlayer insulation layer 25 may be a single layer selected from the group including an oxide layer, a nitride layer and an oxynitride layer.

Figure 8E:
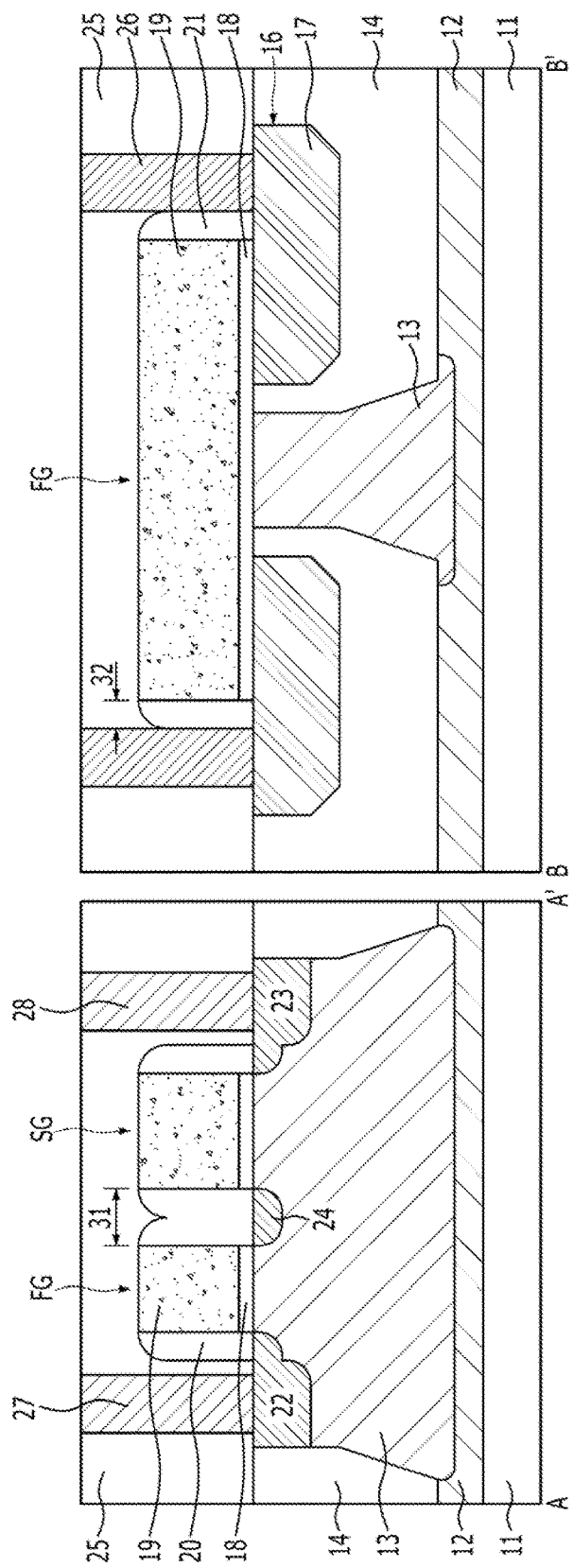

Referring to FIG. 8E, a first contact plug 26 electrically coupling the selection gate SG and the coupling plate 17, a second contact plug 27 contacting the first junction region 22, and a third contact plug 28 contacting the second junction region 23 may be formed. The first contact plug 26 may have sidewalls facing the sidewalls of the floating gate FG and may be formed so that a second gap 32 may be formed between the first contact plug 26 and the floating gate FG. The second gap 32 may be filled with the spacer 20 formed at the sidewalls of the floating gate FG.

Although not illustrated in the drawings, it is possible to complete the nonvolatile memory device in accordance with an embodiment of the present invention by using known semiconductor fabrication processes.

In accordance with the embodiment of the present invention, the nonvolatile memory device may be implemented by adding one mask for forming the trench 16 to form the coupling plate 17 in the device isolation layer 14 in addition to the logic process.

Figure 9:
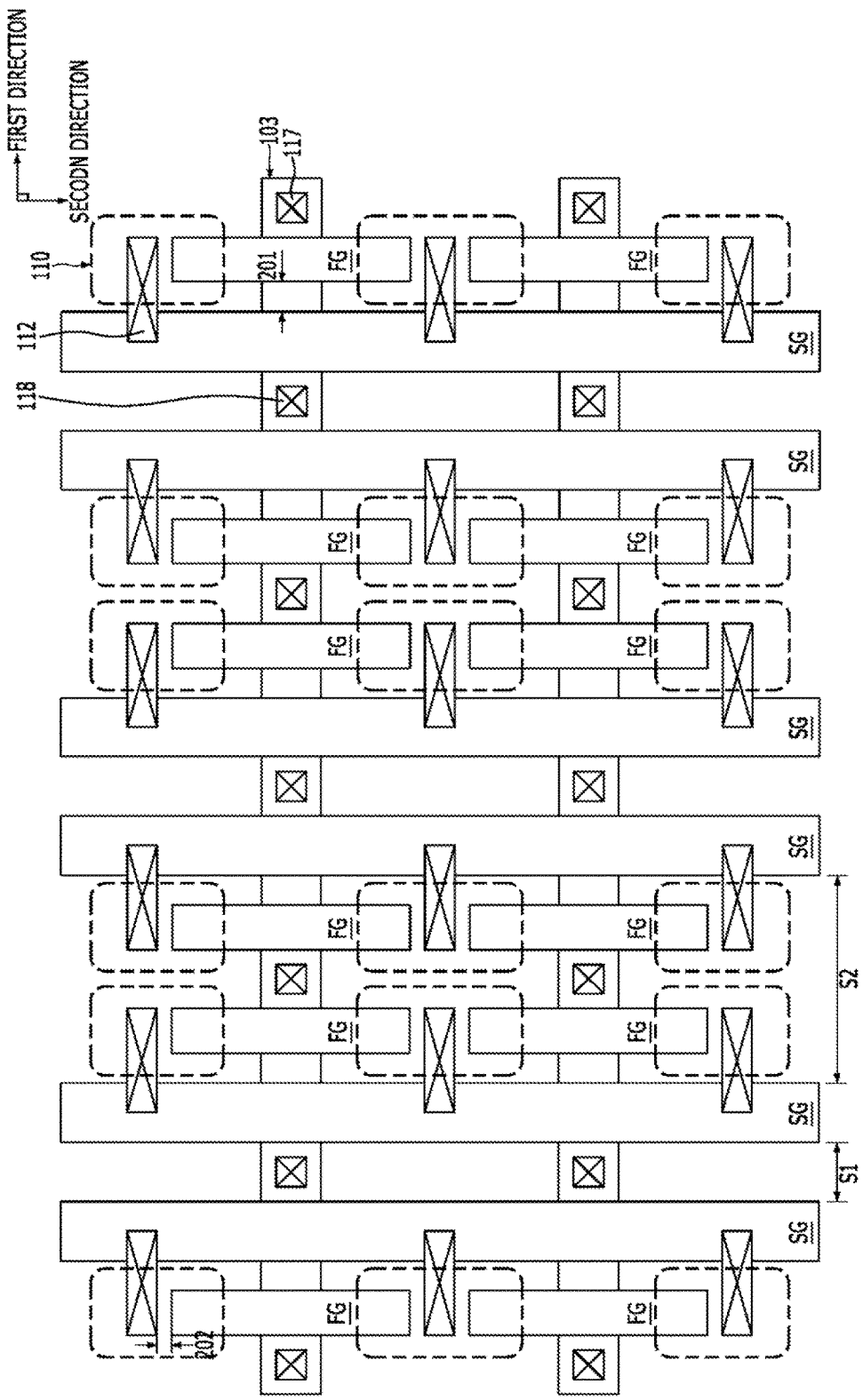
FIG. 9 is a diagram illustrating a cell array of a nonvolatile memory device in accordance with an embodiment of the present invention.

FIG. 9 is a diagram illustrating a cell array of a nonvolatile memory device in accordance with an embodiment of the present invention. A plurality of unit cells may be arranged in the cell array. The unit cell of the nonvolatile memory device in accordance with the embodiment may be applied to the cell array. For clear description, the cell array with the unit cell described above with reference to FIGS. 5 to 7 is described as an example. In the following description, like reference numerals may refer to like elements described above.

Referring to FIG. 9, the cell array in accordance with an embodiment of the present invention may include a plurality of line-type active regions 103 defined by a device isolation layer 102 and extended in a first direction. The plurality of line-type active regions 103 may be disposed at predetermined interval in a second direction. The interval of the active regions 103 in the second direction may be a constant.

In a substrate 101, a plurality of line-type selection gates SG extended in the second direction may be disposed at predetermined interval in the first direction. That is, the selection gates SG may be disposed in the second direction across the plurality of active regions 103. The predetermined interval between the selection gates SG in the first direction may be a first distance S1 or a second distance S2 greater than the first distance S1. The first distance S1 and the second distance S2 may be alternately arranged.

A third contact plug 118 may be coupled to the active region 103 between neighboring selection gates SG having the first distance S1, and a second contact plug 117 may be coupled to the active region 103 between neighboring selection gates SG having the second distance S2. The second contact plug 117 may be located in the center of the active region 103 between neighboring selection gates SG having the second distance S2. Junction regions may be formed in the active region 103 below the second contact plug 117 and the third contact plug 118.

A plurality of floating gates FG may be arranged between neighboring selection gates SG having the second distance S2 so that the plurality of floating gates SG may overlap with the active region 103. Each of the plurality of floating gates FG may be located side by side with the corresponding selection gate SG. The plurality of floating gate FG may be symmetrically arranged in the first direction in reference to the second contact plug 117. The floating gate FG and the adjacent selection gate SG may be arranged side by side at intervals of a first gap 201. Each floating gate FG may have a shape of a bar-type extended in the second direction, and may be disposed across the active region 103 and the device isolation layer 102.

A plurality of coupling plates 110 overlapped with the floating gates FG may be arranged in the device isolation layer 102. The coupling plates 110 may be located between neighboring selection gates SG having the second distance S2. Adjacent floating gates FG in the first direction may not share the coupling plates 110, but adjacent floating gates FG in the second direction may share the coupling plate 110.

A first contact plug 112 electrically coupling the selection gate SG and the coupling plate 110 may be located between adjacent floating gates FG in the second direction. A second gap 202 may be disposed between the first contact plug 112 and the floating gate FG, and the first contact plug 112 may have one or more sidewalls facing the sidewalls of the floating gate FG.

In the cell array described above, the floating gate FG may be coupled in response to a bias applied to the coupling plate 110. Also, the floating gate FG may be coupled in response to a bias applied to the coupling plate 110 and the first contact plug 112 depending on line width of the second gap 202 and the presence or absence of a charge blocking layer filling the second gap 202. Also, the floating gate FG may be coupled in response to a bias applied to the coupling plate 110 and the selection gate SG depending on the presence or absence of a charge blocking layer filling the first gap 201 and a line width of the first gap 201. Also, the floating gate FG may be coupled in response to a bias applied to the coupling plate 110, the selection gate SG and the first contact plug 112 depending on line widths of the first gap 201 and the second gap 202 and the presence or absence of charge blocking layers filling the first gap 201 and the second gap 202.

According to an embodiment of the present invention, the integration degree may be increased by the coupling plate formed in the device isolation layer to overlap with the floating gate. Also, the Integration degree may be further improved by the and the contact plug coupling the floating gate in addition to the coupling plate.

Also, as the coupling ratio with respect to the floating gate increases by adapting the coupling plate, the and the contact plug, the Integration degree may be improved and variety of operating methods may be secured, and thus, the operation characteristics may be improved.

Furthermore, since the coupling plate may not be restricted by the polarity of the bias applied thereto due to the location of the coupling plate in the device isolation layer, the size of the peripheral circuit for supplying a bias to the memory cell may be reduced, and various known operation methods may be applicable.

Since the nonvolatile memory device having the above structure may be formed by adding a mask to the logic process, the reduction in productivity may be prevented.

While the present invention has been described with respect to the specific embodiments, it will be apparent to those skilled in the art that various changes and modifications may be made without departing from the spirit and scope of the invention as defined in the following claims.

What is claimed is:
1. A nonvolatile memory device, comprising:
a substrate including a device isolation layer defining an active region;
a floating gate and a selection gate arranged side by side in a first direction which is parallel to the substrate at intervals of a first gap, over the substrate,
wherein the selection gate has a first surface which is farthest from the substrate and a second surface which is opposite to the first surface and nearest to the substrate;
a coupling plate formed in the device isolation layer and overlapped with the floating gate; and
a contact plug having a first portion which overlaps and directly contacts the first surface of the selection gate and a second portion adjacent to the selection gate which extends from the first portion to the second surface of the selection gate and directly contacts the coupling plate at the device isolation layer, and is suitable for electrically coupling the coupling plate and the selection gate.

2. The nonvolatile memory device of claim 1, wherein the floating gate is coupled in response to a bias applied to the coupling plate.

3. The nonvolatile memory device of claim 1, wherein the nonvolatile memory device further including:
a second gap disposed between the contact plug and the floating gate; and
a charge blocking layer filling the second gap.

4. The nonvolatile memory device of claim 3, wherein the charge blocking layer includes a spacer formed over sidewall of the floating gate.

5. The nonvolatile memory device of claim 4, wherein the floating gate is coupled in response to a bias applied to the coupling plate and the contact plug.

6. The nonvolatile memory device of claim 1, further including:
a charge blocking layer filling the first gap.

7. The nonvolatile memory device of claim 6, wherein the charge blocking layer includes a spacer formed over sidewall of the floating gate and sidewall of the selection gate.

8. The nonvolatile memory device of claim 6, wherein the floating gate is coupled in response to a bias applied to the coupling plate and the selection gate.

9. The nonvolatile memory device of claim 1, further including:
- a first charge blocking layer filling the first gap; and
- a second charge blocking layer filling a second gap disposed between the contact plug and the floating gate.

10. The nonvolatile memory device of claim 9, wherein the first charge blocking layer includes a spacer formed over sidewall of the floating gate and sidewall of the selection gate, and the second charge blocking layer includes a spacer formed over sidewall of the floating gate.

11. The nonvolatile memory device of claim 9, wherein the floating gate is coupled in response to a bias applied to the coupling plate, the selection gate and the contact plug.

12. The nonvolatile memory device of claim 1, wherein the floating gate and the selection gate are extended to a direction crossing the active region, thereby crossing the device isolation layer.

13. The nonvolatile memory device of claim 1, wherein the coupling plate is symmetrically arranged in reference to the active region, or the coupling plate is located one side of the active region.

14. The nonvolatile memory device of claim 1, wherein the coupling plate is extended to overlap with the selection gate.

15. The nonvolatile memory device of claim 1, wherein the contact plug includes one or more plugs having one or more sidewall facing sidewalls of the floating gate.

16. The nonvolatile memory device of claim 1, wherein the contact plug is extended in parallel to the active region.

* * * * *